US010637442B2

(12) United States Patent
Bawell

(10) Patent No.: US 10,637,442 B2
(45) Date of Patent: Apr. 28, 2020

(54) REDUCED TRANSISTOR BRIDGE ATTENUATOR

(71) Applicant: Integrated Device Technology, Inc., San Jose, CA (US)

(72) Inventor: Shawn Bawell, Amherst, NH (US)

(73) Assignee: Integrated Device Technology, Inc., San Jose, CA (US)

( * ) Notice: Subject to any disclaimer, the term of this patent is extended or adjusted under 35 U.S.C. 154(b) by 38 days.

(21) Appl. No.: 16/167,813

(22) Filed: Oct. 23, 2018

(65) Prior Publication Data

US 2019/0131956 A1 May 2, 2019

Related U.S. Application Data

(60) Provisional application No. 62/580,029, filed on Nov. 1, 2017.

(51) Int. Cl.
*H03H 7/24* (2006.01)
*H03H 11/24* (2006.01)
*H03H 7/25* (2006.01)
*H03G 1/00* (2006.01)
*H01C 13/02* (2006.01)
*H03K 17/56* (2006.01)
*H01P 1/22* (2006.01)

(52) U.S. Cl.
CPC .......... *H03H 11/245* (2013.01); *H03G 1/007* (2013.01); *H03G 1/0088* (2013.01); *H03H 7/24* (2013.01); *H03H 7/25* (2013.01); *H01C 13/02* (2013.01); *H01P 1/22* (2013.01); *H03K 17/56* (2013.01)

(58) Field of Classification Search
CPC ........ H03H 11/245; H03H 11/24; H03H 7/25; H03H 7/24; H01P 1/22; H03G 1/0088
USPC ...................................... 333/81 R
See application file for complete search history.

(56) References Cited

U.S. PATENT DOCUMENTS

| 9,374,078 | B2 | 6/2016 | Bawell et al. ................. 333/81 |
| 2006/0114078 | A1* | 6/2006 | Sugimoto ............ H03G 1/0088 333/81 R |
| 2009/0021331 | A1* | 1/2009 | Hwang ..................... H03H 7/25 333/81 R |
| 2014/0002214 | A1 | 1/2014 | Bawell et al. ................. 333/81 |
| 2016/0118959 | A1* | 4/2016 | Atesal ................. H03H 11/245 333/81 R |
| 2017/0104471 | A1* | 4/2017 | Shrivastava ............ H03K 5/08 |

* cited by examiner

Primary Examiner — Stephen E. Jones
(74) Attorney, Agent, or Firm — Christopher P. Maiorana, PC

(57) ABSTRACT

An apparatus includes a bypass circuit a resistor circuit and multiple staggered circuits. The bypass circuit may have a predetermined number of a plurality of transistors connected in series between an input node and an output node. The resistor circuit may have a given number of resistors connected in series between the input node and the output node. Adjoining pairs of the resistors may be connected at given nodes. The staggered circuits may be connected between the given nodes and either the input node or the output node. Each staggered circuit may have a respective number of the transistors connected in series. The bypass circuit, the resistor circuit and the staggered circuits may form part of a bridge attenuator.

19 Claims, 10 Drawing Sheets

REDUCED TRANSISTOR BRIDGE ATTENUATOR

This application relates to U.S. Provisional Application No. 62/580,029, filed Nov. 1, 2017, which is hereby incorporated by reference in its entirety.

FIELD OF THE INVENTION

The invention relates to attenuator circuits generally and, more particularly, to a method and/or apparatus for implementing a reduced transistor bridge attenuator.

BACKGROUND

Bridge attenuators are used to control an attenuation of a signal. Conventional bridge attenuator designs connect field effect transistors in series along parallel paths between an input node and an output node to achieve varying levels of attenuation. A common number of transistors are used in each path. The common number is selected such that a maximum voltage between the input node and the output node does not cause a drain-to-source breakdown of the transistors in any of the paths. A problem with the conventional designs is that a large number of transistors are used to implement the bridge attenuators.

It would be desirable to implement a reduced transistor bridge attenuator.

SUMMARY

The invention concerns an apparatus including a bypass circuit a resistor circuit and multiple staggered circuits. The bypass circuit may have a predetermined number of a plurality of transistors connected in series between an input node and an output node. The resistor circuit may have a given number of resistors connected in series between the input node and the output node. Adjoining pairs of the resistors may be connected at given nodes. The staggered circuits may be connected between the given nodes and either the input node or the output node. Each staggered circuit may have a respective number of the transistors connected in series. The bypass circuit, the resistor circuit and the staggered circuits may form part of a bridge attenuator.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a reduced transistor bridge attenuator that may (i) be implemented with fewer transistors than conventional designs, (ii) form part of a fifth generation (5G) wireless communications system, (iii) operate with drain-to-source breakdown voltages less than a maximum signal voltage, (iv) occupy less area than conventional designs and/or (v) be implemented as one or more integrated circuits.

Embodiments of the present invention generally provide a bridge attenuator circuit having fewer switching transistors than in common designs. The transistor count may be reduced by using a staggered architecture in the bridge arms (e.g., staggered bridges) to reduce the maximum voltage swing seen by each respective bridge arm. Since some of the bridge arms experience a reduced maximum voltage, such bridge arms may be implemented with fewer switching transistors.

Figure 1:
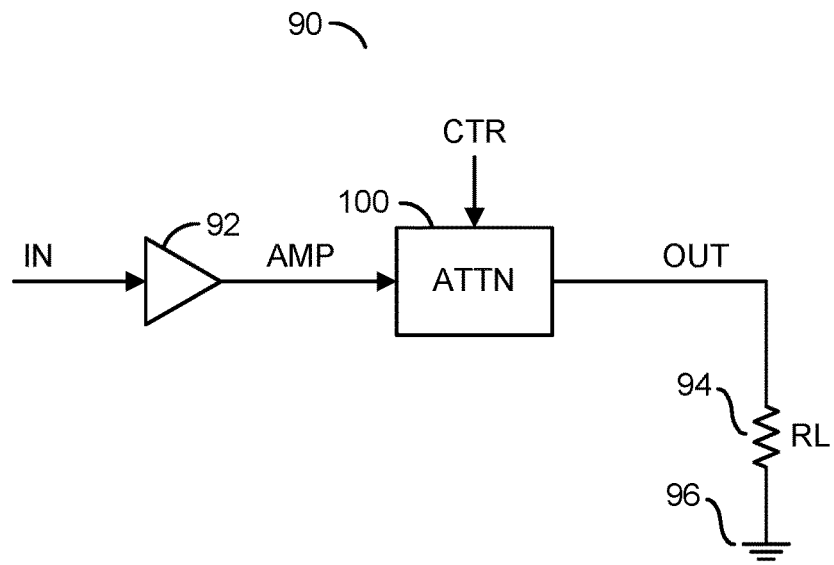
FIG. 1 is a block diagram illustrating an apparatus in accordance with an example embodiment of the invention.

Referring to FIG. 1, a block diagram illustrating an apparatus 90 is shown in accordance with an example embodiment of the invention. The apparatus (or device or system or circuit) 90 may implement an amplifier with variable levels of amplification and/or attenuation. The apparatus 90 generally comprises a block (or circuit) 92, a block (or circuit) 94, a ground node 96 and a block (or circuit) 100.

A signal (e.g., IN) may be received by the block 92. The signal IN may implement an input signal to be amplified/attenuated over a predetermined range. In some embodiments, the signal IN may be a radio-frequency signal. The signal IN may be used in a fifth generation (5G) wireless communications system, a fourth generation (4G) wireless communications system (International Mobile Telecommunications Advanced standard) or a long range wireless communications system. A signal (e.g., AMP) may be generated by the circuit 92 and received by the circuit 100. The signal AMP may be an amplified version of the signal IN. The circuit 100 may receive a signal (e.g., CTR). The signal CTR may be a control signal used to control a level of attenuation. In various embodiments, the signal CTR may contain multiple independent components (or independent control signals). A signal (e.g., OUT) may be generated by the circuit 100 and transferred to the circuit 94. The output signal OUT may implement a variable version of the signal AMP. In some situations, the signal OUT may be the same as the signal AMP. In other situations the signal OUT may be an attenuated version of the signal AMP.

The circuit 92 may implement an amplifier circuit. The amplifier 92 is generally operational to amplify the signal IN to generate the signal AMP. In some embodiments, the amplification may be a fixed amplification (e.g., +20 decibels (dB)). In other embodiments, the amplification may be a variable amplification. Other levels of amplification may be implemented to meet the design criteria of a particular application.

The circuit 94 may implement a load impedance (or circuit). The load impedance 94 may be operational to receive the signal OUT. In various embodiments, the load impedance 94 may be a resistive load, an inductive load, a capacitive load, or a combination of resistance, inductance and/or capacitance to the signal ground node 96.

The circuit 100 may implement a variable attenuation circuit. The attenuation circuit 100 may be operational to attenuate the signal AMP to generate the signal OUT. The level of attenuation may be controlled by the individual components of the signal CTR. In some embodiments, the attenuation level may vary from approximately 0 dB to approximately −30 dB. Other levels of attenuation may be implemented to meet the design criteria of a particular application. In various embodiments, the attenuation circuit 100 may implement a staggered attenuation circuit having fewer transistors than in common designs.

Figure 2:
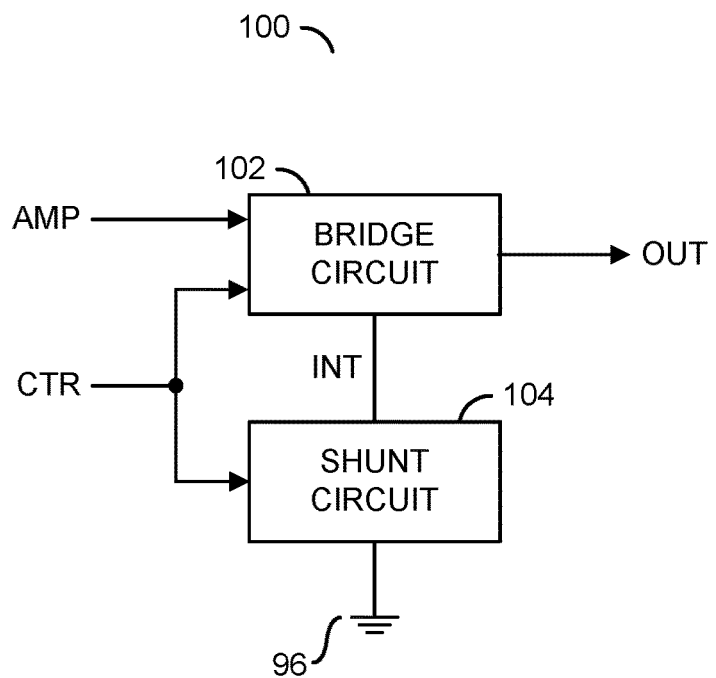
FIG. 2 is a block diagram illustrating an attenuator in the apparatus in accordance with an example embodiment of the invention.

Referring to FIG. 2, a block diagram illustrating an example implementation of the attenuator 100 is shown in accordance with an example embodiment of the invention. The attenuator 100 generally comprises a block (or circuit) 102 and a block (or circuit) 104. The signal AMP may be received by the circuit 102. The signal OUT may be generated and presented by the circuit 102. The circuit CTR may be received by both the circuit 102 and the circuit 104. The circuit 104 may be connected to the signal ground node 96. A signal (e.g., INT) may be exchanged between the circuit 102 and the circuit 104. The signal INT may be an intermediate signal that conveys part of the signal AMP to the signal ground node 96.

The circuit 102 may implement a bridge circuit. The bridge circuit 102 is generally operational to attenuate the signal AMP to generate the signal OUT. The degree of attenuation may be determined by the signal CTR. In some situations, part of the power received in the signal AMP may be dissipated by the circuitry within the bridge circuit 102. In the various situations, part of the power received in the signal AMP may be passed to the circuit 104 in the signal INT. In a bypass situation, all of the power received in the signal AMP may be transferred to the signal OUT.

Figure 3:
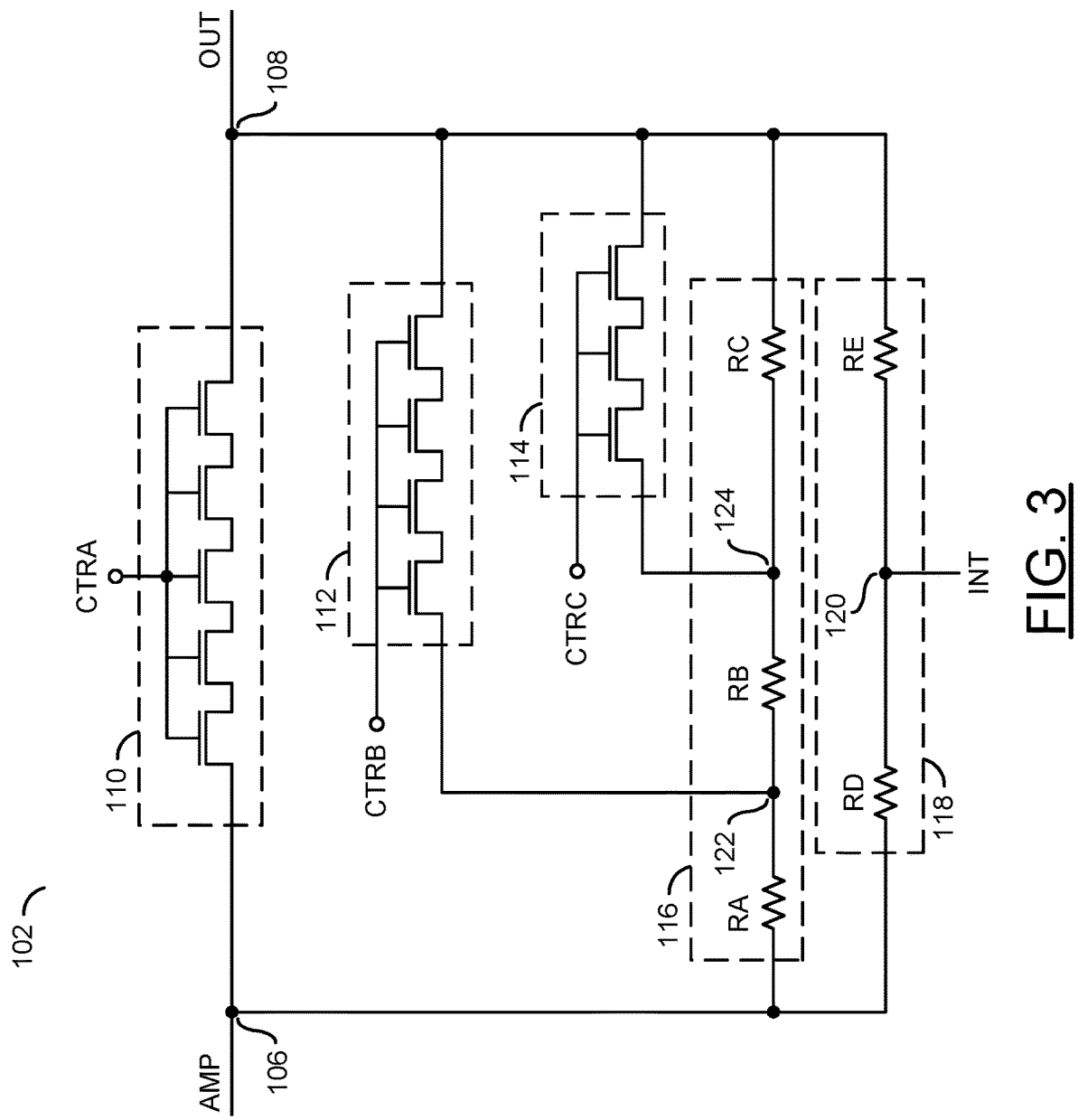
FIG. 3 is a schematic diagram illustrating a bridge circuit in the attenuator in accordance with an example embodiment of the invention.

The circuit 104 may implement a shunt circuit. The shunt circuit 104 is generally operational to present a variable impedance between the bridge circuit 102 and the signal ground node 96. The variable impedance may be determined by the signal CTR. Referring to FIG. 3, a schematic diagram illustrating an example implementation of the bridge circuit 100 is shown in accordance with an example embodiment of the invention. The bridge circuit 100 generally comprises an input node 106, an output node 108, a block (or circuit) 110, a block (or circuit) 112, a block (or circuit) 114, one or more blocks (or circuits) 116 (one shown for simplicity) and a block (or circuit) 118.

The signal AMP may be received at the input node 106. The input node 106 may be connected to all of the circuit 110, the circuit 116 and the circuit 118. The signal OUT may be presented from the output node 108. The output node 108 may be connected to all of the circuit 110, the circuit 112, the circuit 114, the circuit 116 and the circuit 118. The signal INT may be connected to an intermediate node 120 within the circuit 118. The signal CTR may comprise multiple control signals (or components) (e.g., CTRA to CTRC). The signal CTRA may be received by the circuit 110. The signal CTRB may be received by the circuit 112. The signal CTRC may be received by the circuit 114.

The circuit 110 may implement a bypass bridge circuit (or bypass circuit for short). The bypass circuit 110 is generally operational to provide either an open circuit or a closed circuit between the input node 106 and the output node 108 as controlled by the signal CTRA. While the signal CTRA is asserted, the bypass circuit 110 may present a closed state (or condition) between the input node 106 and the output node 108. While the signal CTRA is deasserted, the bypass circuit 110 may present an open state (or condition) between the input node 106 and the output node 108.

The bypass circuit 110 generally comprises multiple transistors (e.g., J transistors) connected in series. In various embodiments, each transistor may be implemented as a field effect transistor. The transistors within the bypass circuit 110 may be wired in series with each other. A gate of each transistor may receive the signal CTRA to switch the transistors between a conducting condition (e.g., the closed state) and a non-conducting condition (e.g., the open state).

The number of transistors in the bypass circuit 110 is generally determined by (i) a maximum voltage swing between the input node 106 and the output node 108 and (ii) a minimum drain-to-source breakdown voltage of each transistor. Consider a case where the minimum drain-to-source breakdown voltage of each transistor is $BV_{DS}$ volts and the maximum voltage swing between the input node 106 and the output node 108 (e.g., at maximum attenuation of the signal AMP) is $V_{MAX}$ volts. By implementing J transistors in the bypass circuit 110, the maximum voltage seen by each transistor will not exceed $BV_{DS}$ volts if $J \times BV_{DS} > V_{MAX}$.

Each circuit 112 and 114 may implement a staggered bridge circuit (or staggered circuit for short). The staggered circuits 112 and 114 are generally operational to provide either the open circuit or the closed circuit between a respective node in the circuit 116 and the output node 108 as controlled by the respective signals CTRB and CTRC. While the signal CTRB is asserted, the staggered circuit 112 may present the closed state (or condition) between an intermediate node 122 within the circuit 116 and the output node 108. While the signal CTRB is deasserted, the staggered circuit 112 may present the open state (or condition) between the intermediate node 122 within the circuit 116 and the output node 108. While the signal CTRC is asserted, the staggered circuit 114 may present the closed state (or condition) between another intermediate node 124 within the circuit 116 and the output node 108. While the signal CTRC is deasserted, the staggered circuit 114 may present the open state (or condition) between the other intermediate node 124 within the circuit 116 and the output node 108. In various embodiments, additional stagger circuits may be added between respective nodes in the circuit 116 and the output node 108. The additional stagger circuits may be controlled by additional components of the signal CTR.

The staggered circuit 112 generally comprises multiple transistors (e.g., K transistors). In various embodiments, each transistor may be implemented as a field effect transistor. The transistors within the staggered circuit 112 may be the same type of transistor(s) as within the bypass circuit 110. The transistors within the staggered circuit 112 may be wired in series with each other. A gate of each transistor may receive the signal CTRB to switch the transistors between the conducting condition (e.g., the closed state) and the non-conducting condition (e.g., the open state).

The number of transistors in the staggered circuit 112 is generally determined by (i) a maximum voltage swing between the intermediate node 122 in the circuit 116 and the output node 108, (ii) a minimum drain-to-source breakdown voltage of each transistor and (iii) a voltage drop from the input node 106 to the intermediate node 122 (e.g., a voltage drop across the resistor RA). In designs where the voltage drop across the resistor RA is greater than the breakdown voltage $BV_{DS}$, the number K of transistors in the stagger circuit 112 may be fewer than the number J of transistors in the bypass circuit 110 (e.g., K<J).

The staggered circuit 114 generally comprises multiple transistors (e.g., L transistors). In various embodiments, each transistor may be implemented as a field effect transistor. The transistors within the staggered circuit 114 may be the same type of transistor(s) as within the bypass circuit 110 and/or the staggered circuit 112. The transistors within the staggered circuit 114 may be wired in series with each other. A gate of each transistor may receive the signal CTRC to switch the transistors between the conducting condition (e.g., the closed state) and the non-conducting condition (e.g., the open state). In various embodiments, the staggered circuit 114 may have fewer numbers of transistors than the staggered circuit 112. The staggered circuit 114 generally has fewer numbers of the transistors than the bypass circuit 110.

The number of transistors in the staggered circuit 114 is generally determined by (i) a maximum voltage swing between an intermediate node 124 in the circuit 116 and the output node 108, (ii) a minimum drain-to-source breakdown voltage of each transistor and (iii) a voltage drop from the input node 106 to the intermediate node 124 (e.g., a voltage drop across the resistors RA and RB). In designs where the voltage drop across the resistors RA and RB is greater than the breakdown voltage $BV_{DS}$, the number L of transistors in the stagger circuit 114 may be fewer than the number K of transistors in the stagger circuit 112 (e.g., L<K). As a result, the total number of transistors in the bridge circuit 102 (e.g., J+K+L) may be fewer than the number of transistors in a common bridge circuit (e.g., J+J+J) with the same number of active bridges between the input node 106 and the output node 108. By utilizing fewer transistors, the bridge circuit 102 may occupy a smaller area than common bridge circuits.

The circuit 116 may implement a resistor bridge circuit (or resistor circuit for short). The resistor circuit 116 is generally operational to provide a series resistance between the input node 106 and the output node 108. The resistor circuit 116 generally comprises multiple resistors RA to RC. The resistors RA to RC may be wired to each other in series. Each junction of two (or an adjoining pair) of the resistors RA to RC may form the intermediate nodes 122 and 124. Each intermediate node 122 and 124 within the resistor circuit 116 may be connected to an end of the staggered circuits 112 and 114 opposite the output node 108. Generally, the resistor circuit 116 may have at least one more resistor than the number of staggered circuits. In the example, three resistors RA to RC are shown. In various embodiments, more than three resistors may be implemented to meet the design criteria of a particular application.

The circuit 118 may implement another resistor bridge circuit (or resistor circuit for short). The resistor circuit 118 generally comprises two or more resistors (e.g., RD to RE). The resistors RD to RE may be wired together in series. The intermediate node 120 may be established between two of the resistors (e.g., between the resistor RD and the resistor RE). The intermediate node 120 may be connected to the shunt circuit 104 and carry the signal INT.

Consider an example involving just the bridge circuit 100 where (i) the minimum drain-to-source breakdown voltage $BV_{DS}$ of each transistor is 3 volts, (ii) the maximum voltage swing of the signal AMP is 16 volts and (iii) the resistor RB=2xRA and RC=3xRA (e.g., a total resistance of the circuit 116 is 6xRA). While the bridge circuit 100 is in a bypass mode (e.g., no attenuation), the signal CTRA may be asserted and all of the transistors in the bypass circuit 110 are in the closed state. As such, the signal OUT generally tracks the signal AMP and the voltage difference between the input node 106 and the output node 108 is essentially zero volts (ignoring the voltage drop across the closed-state transistors). The voltage difference between the intermediate node 122 and the output node 108 is zero volts. Likewise, the voltage difference between the intermediate node 124 and the output node 108 is zero volts.

When the bridge circuit 100 is set at a maximum attenuation level (e.g., all of signals CTRA, CTRB and CTRC are deasserted), the signal OUT may be at a fraction (e.g., ⅛th in the example) of the signal AMP. The maximum voltage difference between the input node 106 and the output node 108 may thus be approximately (16 volts-2 volts=) 14 volts. Since the bypass circuit 110 is subject to the full 14 volt difference, five transistors may be included in the bypass circuit 110 such that drain-to-source voltage across each transistor (e.g., 14 volts/5 transistors=2.8 volts/transistor) is less than the breakdown voltage $BV_{DS}$ of 3 volts.

The voltage across the staggered circuit 112 may be the voltage across the resistors RB and RC. In the example, the voltage across the resistors RB and RC may be approximately (5/6×14 volts=) 11.7 volts. Therefore, the staggered circuit 112 may be implemented with four transistors such that drain-to-source voltage across each transistor (e.g., 11.7 volts/4 transistors=2.9 volts/transistor) is less than the breakdown voltage $BV_{DS}$ of 3 volts. In a common design, the staggered circuit 112 would span from the input node 106 to the output node 108, would experience the full 14 volt difference, and so would be implemented with 5 transistors.

The voltage across the open-state staggered circuit 114 may be the voltage across the resistor RC. In the example, the voltage across the resistor RC may be approximately (3/6×14 volts=) 7 volts. Therefore, the staggered circuit 114 may be implemented with three transistors such that drain-to-source voltage across each transistor (e.g., 7 volts/3 transistors=2.3 volts/transistor) is less than the breakdown voltage $BV_{DS}$ of 3 volts. In a common design, the staggered circuit 114 would span from the input node 106 to the output node 108, would experience the full 14 volt difference, and so would be implemented with 5 transistors. As such, the invention may be implemented with fewer (e.g., 5+4+3=12) transistors than the number of transistors (e.g., 5+5+5=15) in a common design. Utilizing fewer transistors may allow the invention to occupy a smaller circuit area than common designs.

Figure 4:
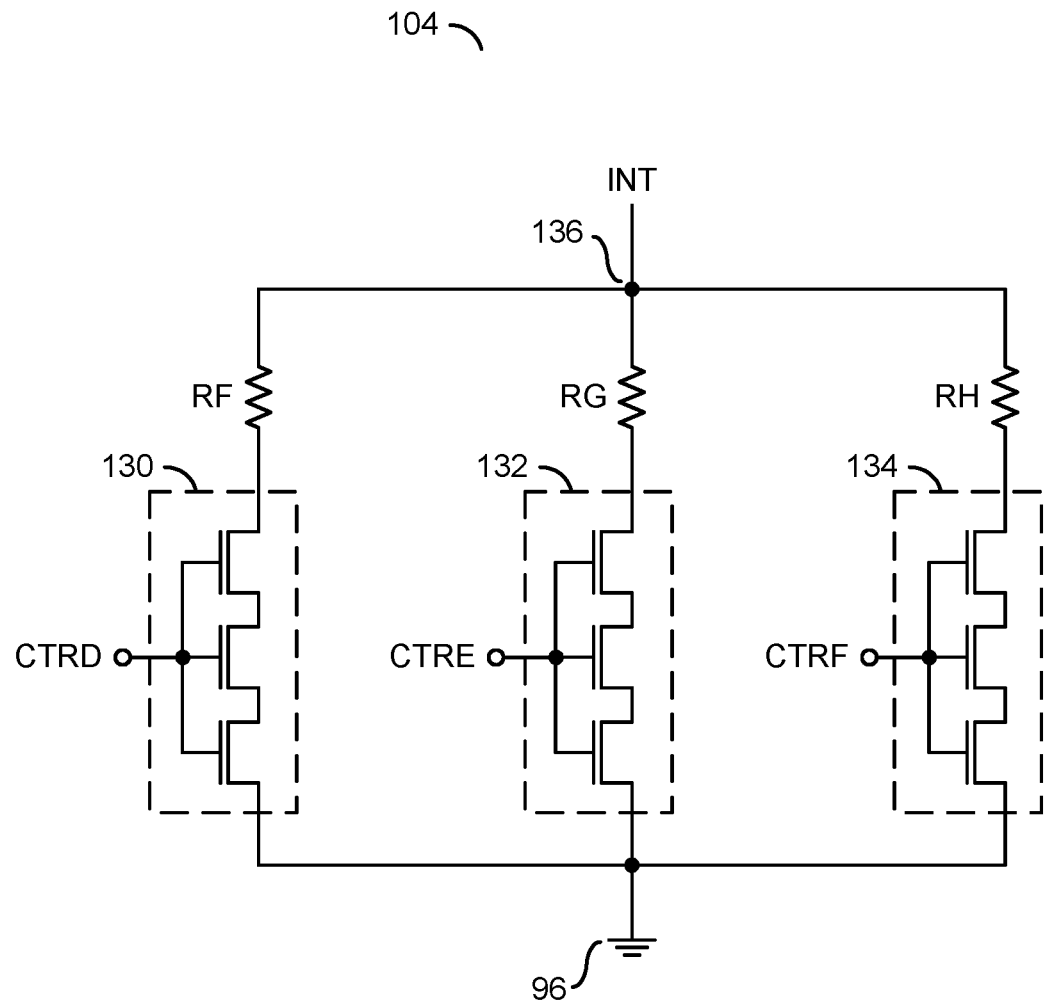
FIG. 4 is schematic diagram illustrating a shunt circuit in the attenuator in accordance with an example embodiment of the invention.

Referring to FIG. 4, a schematic diagram illustrating an example implementation of the shunt circuit 104 is shown in accordance with an example embodiment of the invention. The shunt circuit 104 generally comprises a block (or circuit) 130, a block (or circuit) 132, a block (or circuit) 134, an intermediate node 136 and multiple resistors (e.g., RF to RH). The intermediate node 136 of the shunt circuit 104 may be connected to the intermediate node 120 of the bridge circuit 102. In various embodiments, the intermediate node 136 and the intermediate node 120 may be the same node. The resistors RF, RG and RH may all be connected to the intermediate node 136. The signal INT may be received by the circuits 130, 132 and 134 through the respective resistors RF, RG and RH. Each circuit 130, 132 and 134 may have an end connected to the signal ground node 96. The circuit 130 may receive a signal (e.g., CTRD). The circuit 132 may receive a signal (e.g., CRTE). The circuit 134 may receive a signal (e.g., CRTF). Each signal CTRD, CTRE and CTRF may be a component of the control signal CTR.

Each circuit 130-134 may implement a shunt arm circuit (or arm circuit for short). The arm circuits 130-134 may be operational to provide either the open circuit condition or the closed circuit condition between the respective resistors RF to RH and the signal ground node 96. The open/closed conditions may be controlled by the respective signals CTRD, CTRE and CTRF.

Each arm circuit 130-134 may include multiple transistors (e.g., S, T and U transistors respectively). The transistors in each arm circuit 130-134 may be wired together in series. In various embodiments, each transistor may be a field effect transistor. The transistors within each arm circuit 130-134 may be the same type of transistor(s) as the transistors in the bridge circuit 102. In various embodiments, the number of transistors S in the arm circuit 130 may be the same as the number of transistors T in the arm circuit 132 and the number of transistors U in the arm circuit 134 (e.g., S=T=U).

A gate of each transistor in the arm circuit 130 may be controlled by the signal CTRD. While the signal CTRD is asserted, the arm circuit 130 may present the closed state (or condition) between the resistor RF and the signal ground node 96. While the signal CTRD is deasserted, the arm circuit 130 may present the open state (or condition) between the resistor RF and the signal ground node 96. While the signal CTRE is asserted, the arm circuit 132 may present the closed state (or condition) between the resistor RG and the signal ground node 96. While the signal CTRE is deasserted, the arm circuit 132 may present the open state (or condition) between the resistor RG and the signal ground node 96. While the signal CTRF is asserted, the arm circuit 134 may present the closed state (or condition) between the resistor RH and the signal ground node 96. While the signal CTRF is deasserted, the arm circuit 134 may present the open state (or condition) between the resistor RH and the signal ground node 96. In various embodiments, additional resistors and additional arm circuits may be added between the intermediate node 136 and the signal ground node 96. The additional resistors and arm circuits may be controlled by additional components of the signal CTR.

Figure 5:
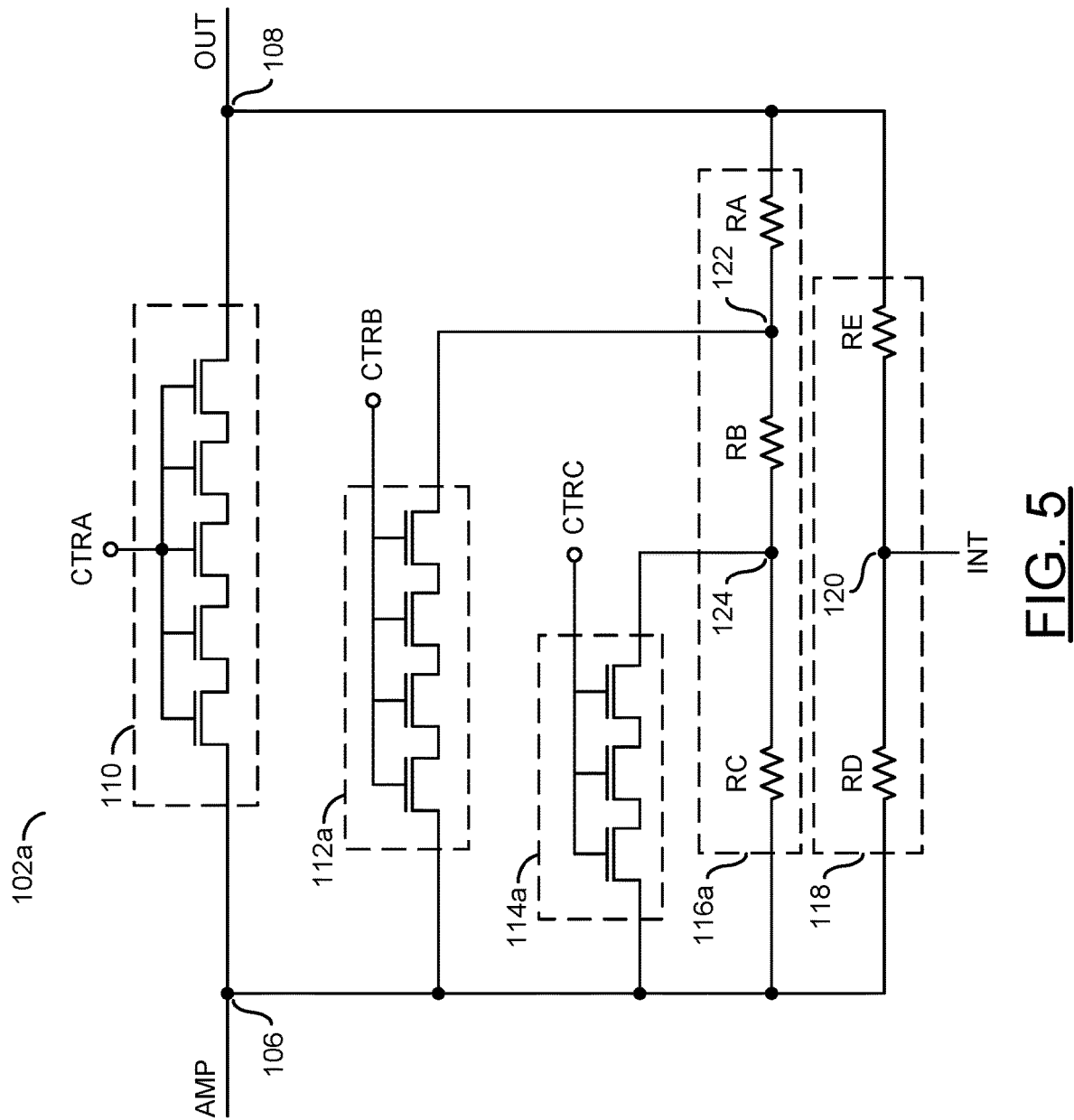
FIG. 5 is a schematic diagram illustrating another bridge circuit in accordance with an example embodiment of the invention.

Referring to FIG. 5, a schematic diagram illustrating an example implementation of a bridge circuit 102a is shown in accordance with an example embodiment of the invention. The bridge circuit 102a may be a variation of the bridge circuit 102. The bridge circuit 102a may be connected to the amplifier 92, the load impedance 94 and the arm circuit 104 the same way as the bridge circuit 102.

The bridge circuit 102a generally comprises the bypass circuit 110, a block (or circuit) 112a, a block (or circuit) 114a, a block (or circuit) 116a and the resistor circuit 118. The signal AMP may be received by the bypass circuit 110, the circuit 112a, the circuit 114a, the circuit 116a and the resistor circuit 118. The signal OUT may be created by the bypass circuit 110, the circuit 116a and the circuit 118. The signal INT may be presented from the node 120 within the resistor circuit 118. The signal CTRA may be received by the bypass circuit 110. The signal CTRB may be received by the circuit 112a. The signal CTRC may be received by the circuit 114a.

Each circuit 112a and 114a may implement a staggered bridge circuit (or staggered circuit for short). The staggered circuits 112a and 114a are generally operational to provide either the open circuit or the closed circuit between respective nodes 122 and 124 in the circuit 116a and the input node 106 as controlled by the respective signals CTRB and CTRC. While the signal CTRB is asserted, the staggered circuit 112a may present the closed state (or condition) between the input node 106 and the intermediate node 122 within the circuit 116a. While the signal CTRB is deasserted, the staggered circuit 112a may present the open state (or condition) between the input node 106 and the intermediate node 122 within the circuit 116a. While the signal CTRC is asserted, the staggered circuit 114a may present the closed state (or condition) between the input node 106 and the intermediate node 124 within the circuit 116a. While the signal CTRC is deasserted, the staggered circuit 114 may present the open state (or condition) between the input node 106 and the intermediate node 124 within the circuit 116a. In various embodiments, additional stagger circuits may be added between the input node 106 and the respective nodes in the circuit 116a. The additional stagger circuits may be controlled by additional components of the signal CTR.

The staggered circuit 112a generally comprises multiple transistors (e.g., K transistors). In various embodiments, each transistor may be implemented as a field effect transistor. The transistors within the staggered circuit 112a may be the same type of transistor(s) as within the bypass circuit 110. The transistors within the staggered circuit 112a may be wired in series with each other. A gate of each transistor may receive the signal CTRB to switch the transistors between the conducting condition (e.g., the closed state) and the non-conducting condition (e.g., the open state).

The number of transistors in the staggered circuit 112a is generally determined by (i) a maximum voltage swing between the intermediate node 122 in the circuit 116a and the input node 106, (ii) a minimum drain-to-source breakdown voltage of each transistor and (iii) a voltage drop from the output node 108 to the respective node 122 (e.g., a voltage drop across the resistor RA). In designs where the voltage drop across the resistor RA is greater than the breakdown voltage $BV_{DS}$, the number K of transistors in the stagger circuit 112a may be fewer than the number J of transistors in the bypass circuit 110 (e.g., K<J).

The staggered circuit 114a generally comprises multiple transistors (e.g., L transistors). In various embodiments, each transistor may be implemented as a field effect transistor. The transistors within the staggered circuit 114a may be the same type of transistor(s) as within the bypass circuit 110 and/or the staggered circuit 112a. The transistors within the staggered circuit 114a may be wired in series with each other. A gate of each transistor may receive the signal CTRC to switch the transistors between the conducting condition (e.g., the closed state) and the non-conducting condition (e.g., the open state). In various embodiments, the staggered circuit 114a may have fewer transistors than the staggered circuit 112a. The staggered circuit 114a generally has fewer transistors than the bypass circuit 110.

The number of transistors in the staggered circuit 114a is generally determined by (i) a maximum voltage swing between the intermediate node 124 in the circuit 116a and the input node 106, (ii) a minimum drain-to-source breakdown voltage of each transistor and (iii) a voltage drop from the output node 108 to the respective node 124 (e.g., a voltage drop across the resistors RA and RB). In designs where the voltage drop across the resistors RA and RB is greater than the breakdown voltage $BV_{DS}$, the number L of transistors in the stagger circuit 114a may be fewer than the number K of transistors in the stagger circuit 112a (e.g., L<K). As a result, the total number of transistors in the bridge circuit 102a (e.g., J+K+L) may be fewer than the number of transistors in a common bridge circuit (e.g., J+J+J) with the same number of active bridges between the input node 106 and the output node 108. The fewer number of transistors in the bridge circuit 102a may occupy a smaller area than in common bridge circuits.

The circuit 116a may implement a resistor bridge circuit (or resistor circuit for short). The resistor circuit 116a is generally operational to provide a series resistance between the input node 106 and the output node 108. The resistor circuit 116a generally comprises multiple resistors RA to RC. The resistors RA to RC may be wired to each other in series. The resistor circuit 116a may be a variation of the resistor circuit 116 with the order of the resistors RA to RC and the order of the nodes 122 to 124 reversed between the input node 106 and the output node 108. In the example, three resistors RA to RC are shown. In various embodiments, more than three resistors may be implemented to meet the design criteria of a particular application.

Figure 6:
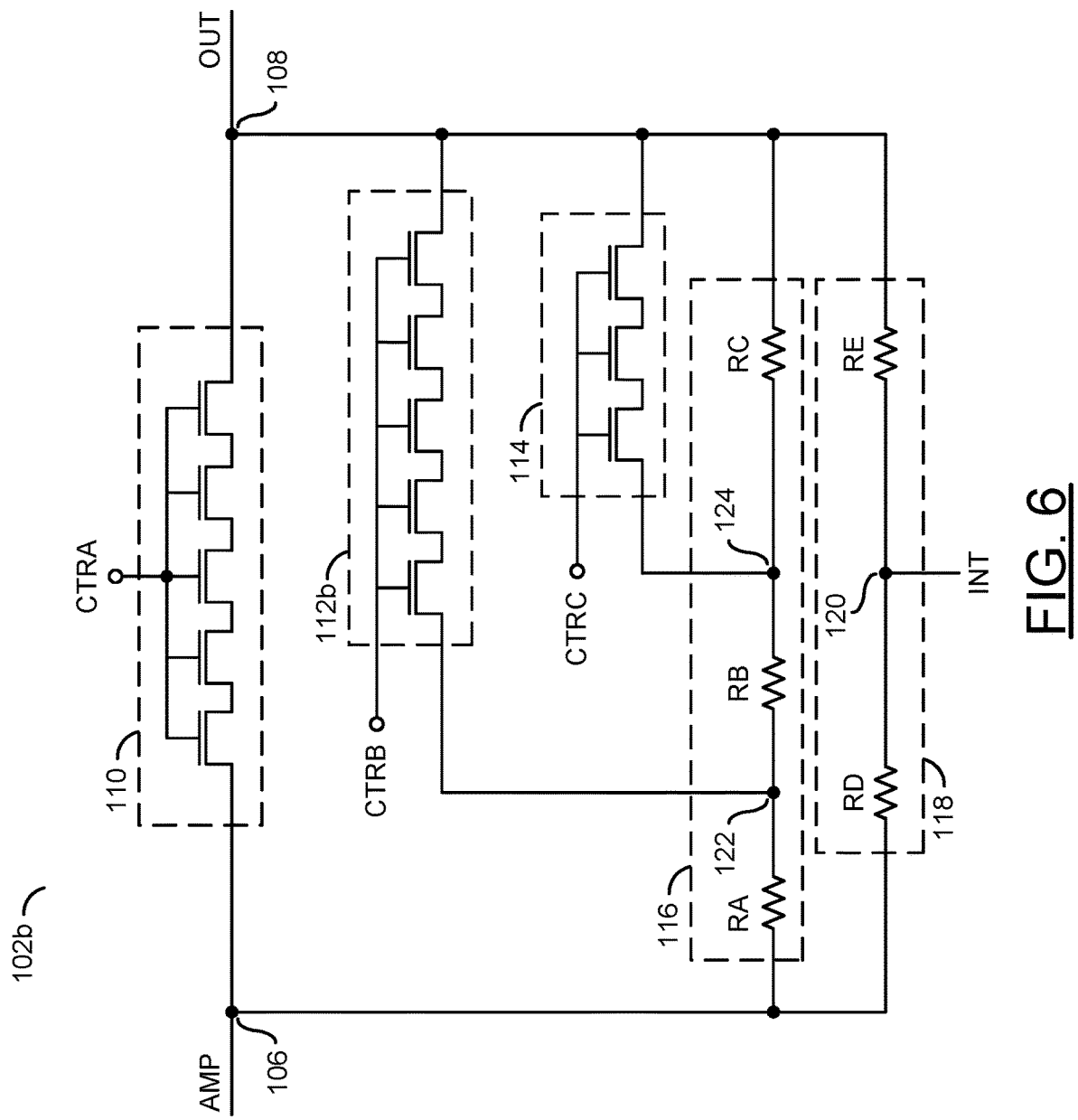
FIG. 6 is a schematic diagram illustrating yet another bridge circuit in accordance with an example embodiment of the invention.

Referring to FIG. 6, a schematic diagram illustrating an example implementation of a bridge circuit 102b is shown in accordance with an example embodiment of the invention. The bridge circuit 102b may be a variation of the bridge circuits 102 and/or 102a. The bridge circuit 102b may be connected to the amplifier 92, the load impedance 94 and the shunt circuit 104 the same way as the bridge circuits 102 and 102a. In various embodiments, the bridge circuit 102b may have at least two among the bypass circuit and/or the stagger circuits having a same number of transistors.

The bridge circuit 102b generally comprises the bypass circuit 110, a block (or circuit) 112b, the stagger circuit 114, the resistor circuit 116 and the resistor circuit 118. The signal AMP may be received by the bypass circuit 110, the resistor circuit 116 and the resistor circuit 118. The signal OUT may be created by the bypass circuit 110, the circuit 112b, the stagger circuit 114, the resistor circuit 116 and the resistor circuit 118. The signal INT may be presented from a node within the resistor circuit 118. The signal CTRA may be received by the bypass circuit 110. The signal CTRB may be received by the circuit 112b. The signal CTRC may be received by the stagger circuit 114a.

The circuit 112b may implement a staggered bridge circuit (or staggered circuit for short). The staggered circuit 112b is generally operational to provide either the open circuit or the closed circuit between the node 122 in the resistor circuit 116 and the output node 108 as controlled by the signal CTRB. While the signal CTRB is asserted, the staggered circuit 112b may present the closed state (or condition) between the node 122 and the output node 108. While the signal CTRB is deasserted, the staggered circuit 112b may present the open state (or condition) between the node 122 and the output node 108.

The staggered circuit 112b generally comprises multiple transistors (e.g., K transistors). In various embodiments, each transistor may be implemented as a field effect transistor. The transistors within the staggered circuit 112b may be the same type of transistor(s) as within the bypass circuit 110. The transistors within the staggered circuit 112b may be wired in series with each other. A gate of each transistor may receive the signal CTRB to switch the transistors between the conducting condition (e.g., the closed state) and the non-conducting condition (e.g., the open state).

The number of transistors in the staggered circuit 112b is generally determined by (i) a maximum voltage swing between the intermediate node 122 in the resistor circuit 116 and the output node 108, (ii) a minimum drain-to-source breakdown voltage of each transistor and (iii) a voltage drop from the input node 106 to the node 122 (e.g., a voltage drop across the resistor RA). In various designs (e.g., where the voltage drop across the resistor RA is less than the breakdown voltage $BV_{DS}$), the number (e.g., K) of transistors in the stagger circuit 112b may match the number of transistors than the bypass circuit 110 (e.g., J=K). The number of transistors in the stagger circuit 112b and the bypass circuit 110 may still be greater than the number of transistors in the stagger circuit 114 (e.g., J=K>L). In various embodiments, additional stagger circuits with the same number of transistors as the bypass circuit 110 and the stagger circuit 112b may be added between the respective nodes within the resistor circuit 116 and the output node 108. The additional stagger circuits may be controlled by additional components of the signal CTR.

Figure 7:
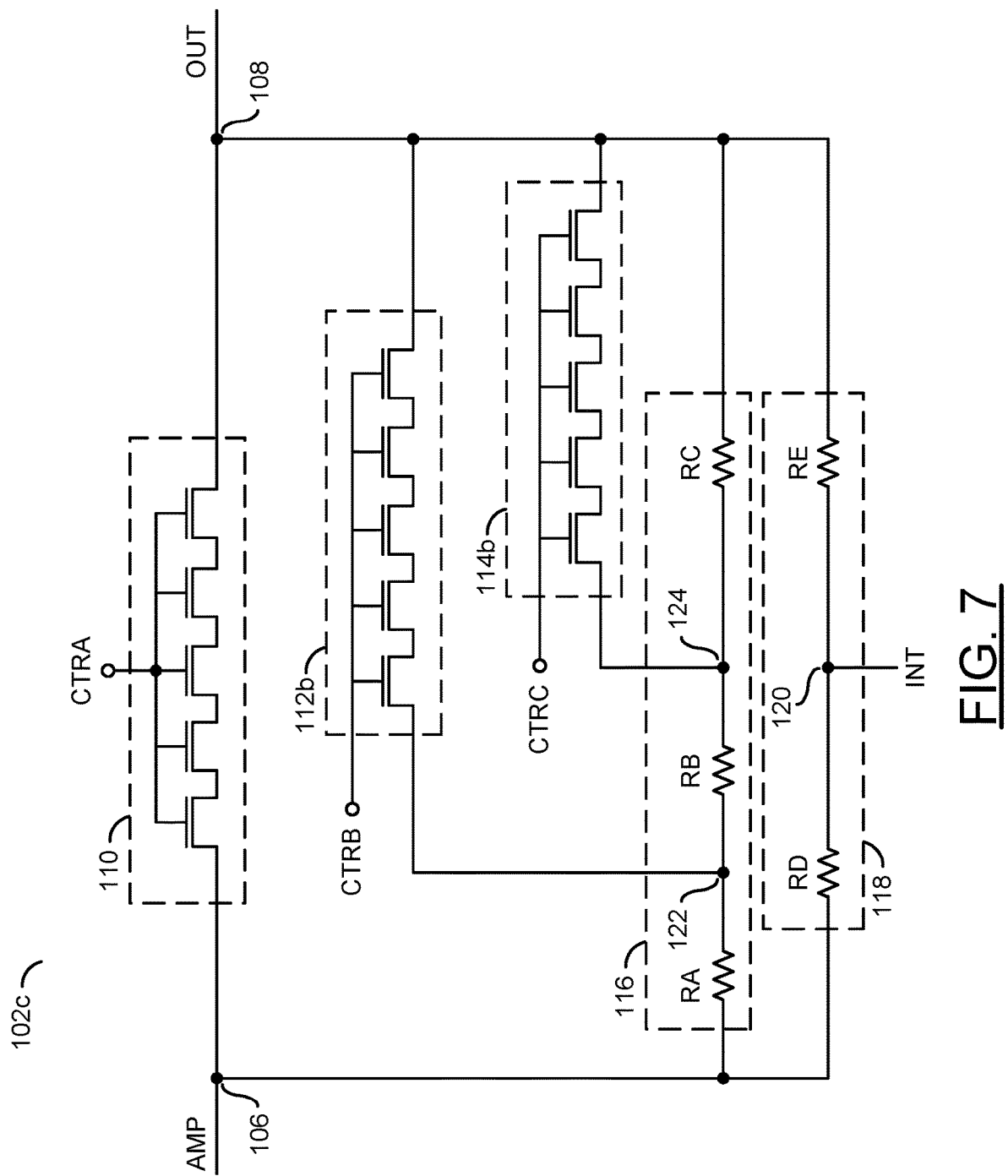
FIG. 7 is a schematic diagram illustrating still another bridge circuit in accordance with an example embodiment of the invention.

Referring to FIG. 7, a schematic diagram illustrating an example implementation of a bridge circuit 102c is shown in accordance with an example embodiment of the invention. The bridge circuit 102c may be a variation of the bridge circuits 102, 102a and/or 102b. The bridge circuit 102c may be connected to the amplifier 92, the load impedance 94 and the shunt circuit 104 the same way as the bridge circuits 102, 102a and 102b. In various embodiments, the bridge circuit 102c may have the same number of transistors in all of the bypass circuit and/or the stagger circuits.

The bridge circuit 102c generally comprises the bypass circuit 110, the stagger circuit 112b, a block (or circuit) 114b, the resistor circuit 116 and the resistor circuit 118. The signal AMP may be received by the bypass circuit 110, the resistor circuit 116 and the resistor circuit 118. The signal OUT may be created by the bypass circuit 110, the stagger circuit 112b, the circuit 114b, the resistor circuit 116 and the resistor circuit 118. The signal INT may be presented from the node 120 within the resistor circuit 118. The signal CTRA may be received by the bypass circuit 110. The signal CTRB may be received by the stagger circuit 112b. The signal CTRC may be received by the circuit 114a.

The circuit 114b may implement a staggered bridge circuit (or staggered circuit for short). The staggered circuit 114b is generally operational to provide either the open circuit or the closed circuit between the node 124 in the resistor circuit 116 and the output node 108 as controlled by the signal CTRC. While the signal CTRC is asserted, the staggered circuit 114b may present the closed state (or condition) between the node 124 and the output node 108. While the signal CTRC is deasserted, the staggered circuit 114b may present the open state (or condition) between the node 124 and the output node 108.

The staggered circuit 114b generally comprises multiple transistors (e.g., L transistors). In various embodiments, each transistor may be implemented as a field effect transistor. The transistors within the staggered circuit 114b may be the same type of transistor(s) as within the bypass circuit 110. The transistors within the staggered circuit 114b may be wired in series with each other. A gate of each transistor may receive the signal CTRC to switch the transistors between the conducting condition (e.g., the closed state) and the non-conducting condition (e.g., the open state).

The number of transistors in the staggered circuit 114b is generally determined by (i) a maximum voltage swing between the intermediate node 124 in the resistor circuit 116 and the output node 108, (ii) a minimum drain-to-source breakdown voltage of each transistor and (iii) a voltage drop from the input node 106 to the node 124 (e.g., a voltage drop across the resistors RA and RB). In various designs (e.g., where the voltage drop across the resistors RA and RB is less than the breakdown voltage $BV_{DS}$), the number (e.g., L) of transistors in the stagger circuit 114*b* may match the number of transistors than the bypass circuit 110 and the stagger circuit 114*b* (e.g., J=K=L). In various embodiments, additional stagger circuits with the same number of transistors as the bypass circuit 110 and the stagger circuit 112*b* may be added between the respective nodes within the resistor circuit 116 and the output node 108. The additional stagger circuits may be controlled by additional components of the signal CTR.

Figure 8:
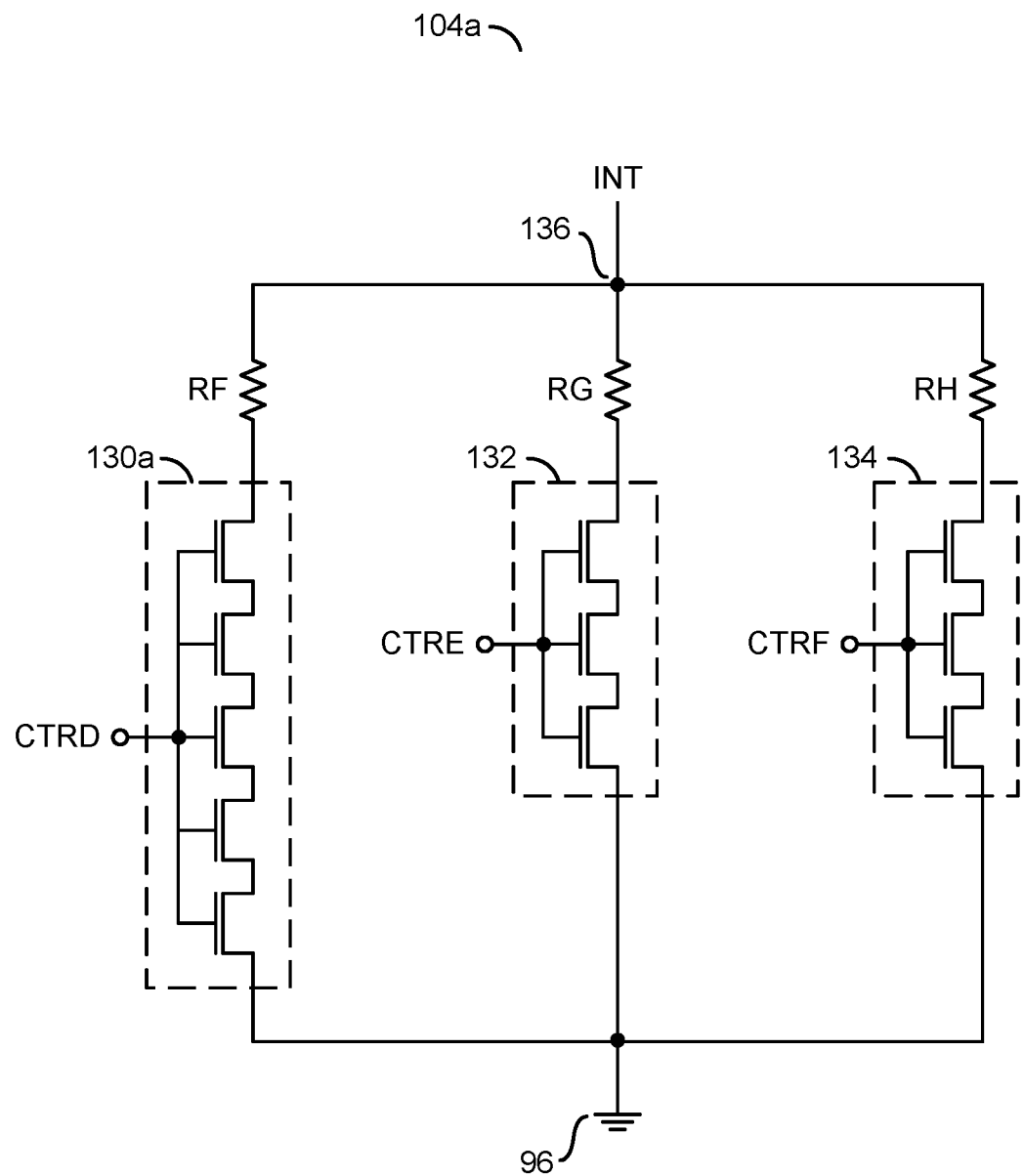
FIG. 8 is a schematic diagram illustrating another shunt circuit in accordance with an example embodiment of the invention.

Referring to FIG. 8, a schematic diagram illustrating an example implementation of a shunt circuit 104*a* is shown in accordance with an example embodiment of the invention. The shunt circuit 104*a* may be a variation of the shunt circuit 104. The shut circuit 104*a* may be connected to the bridge circuits 102, 102*a* and/or 102*b* the same way as the shunt circuit 104. In various embodiments, the shunt circuit 104*a* may have at least one arm circuit with a different number of transistors than the other arm circuits.

The shunt circuit 104*a* generally comprises a block (or circuit) 130*a*, the arm circuit 132, the arm circuit 134 and the resistors RF-RH. The intermediate node 136 of the shunt circuit 104*a* may be connected to the intermediate node 120 of a bridge circuit 102/102*a*/102*b* to receive the signal INT. The intermediate node 136 may be connected through the resistors RF-RH to respective ends of the circuits 130*a*-134. The other ends of the circuits 130*a*-134 may be connected to the signal ground node 96.

The circuit 130*a* may implement a shunt arm circuit (or arm circuit for short). The arm circuit 130*a* may be operational to provide either the open circuit condition or the closed circuit condition between the resistors RF and the signal ground node 96. The open/closed conditions may be controlled by the signals CTRD.

The arm circuit 130*a* may include multiple transistors (e.g., S transistors). The transistors in the circuit 130*a* may be wired together in series. In various embodiments, each transistor may be a field effect transistor. The transistors within the arm circuit 130*a* may be the same type of transistor(s) as the transistors in the bridge circuits 102-102*b*. In various embodiments, the number of transistors S in the arm circuit 130*a* may be different than the number of transistors T in the arm circuit 132 and the number of transistors U in the arm circuit 134 (e.g., S>T=U or S<T=U).

A gate of each transistor in the arm circuit 130*a* may be controlled by the signal CTRD. While the signal CTRD is asserted, the arm circuit 130*a* may present the closed state (or condition) between the resistor RF and the signal ground node 96. While the signal CTRD is deasserted, the arm circuit 130*a* may present the open state (or condition) between the resistor RF and the signal ground node 96. In various embodiments, additional resistors and additional arm circuits may be added between the intermediate node 136 and the signal ground node 96. The additional arm circuits may have the same number of transistors as (i) the arm circuit 130*a* or (ii) the arm circuits 132-134. The additional arm circuits may be controlled by additional components of the signal CTR.

Figure 9:
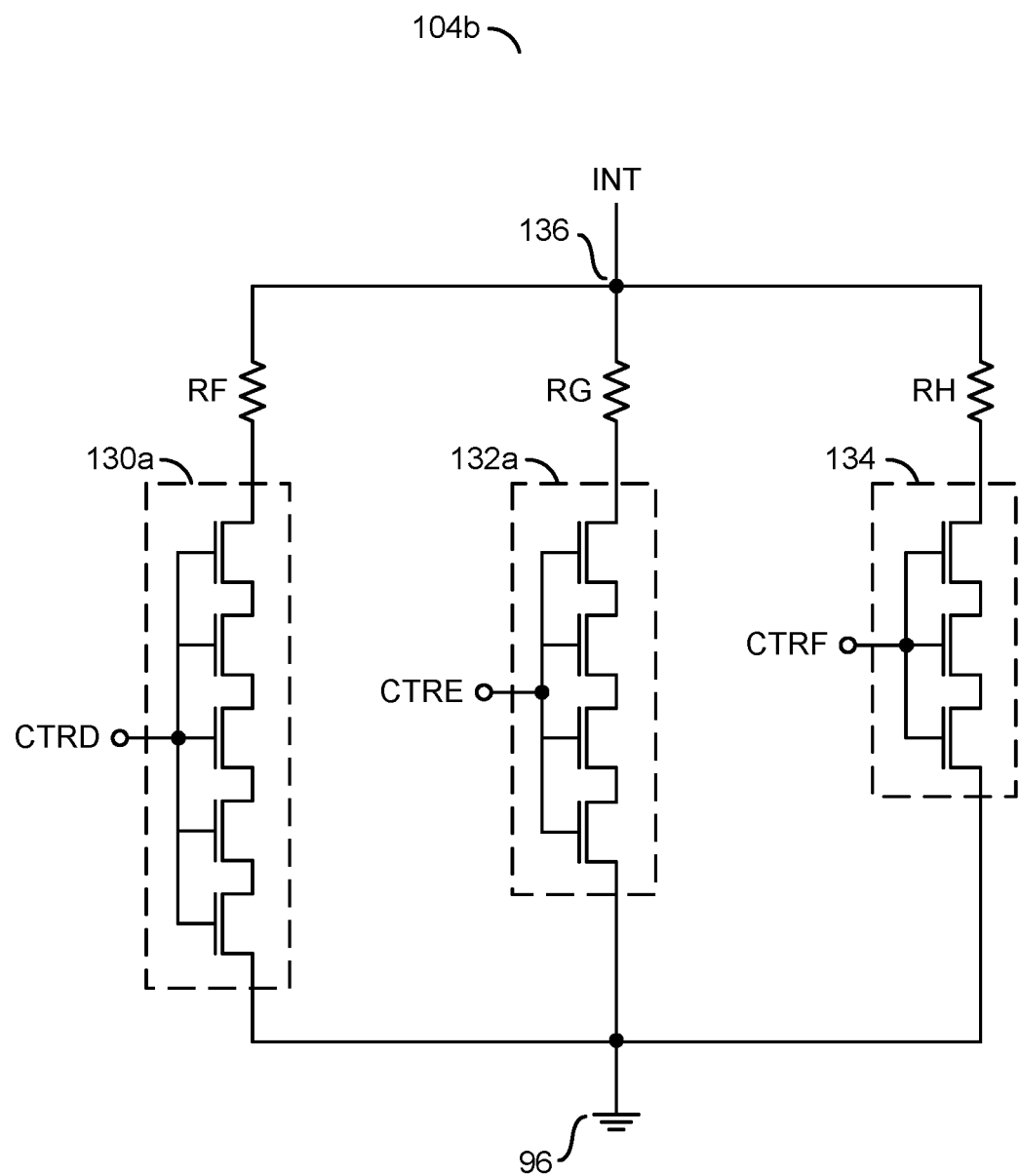
FIG. 9 is a schematic diagram illustrating still another shunt circuit in accordance with an example embodiment of the invention.

Referring to FIG. 9, a schematic diagram illustrating an example implementation of a shunt circuit 104*b* is shown in accordance with an example embodiment of the invention. The shunt circuit 104*b* may be a variation of the shunt circuits 104 and/or 104*a*. The shut circuit 104*b* may be connected to the bridge circuits 102, 102*a* and/or 102*b* the same way as the shunt circuits 104-104*a*. In various embodiments, the shunt circuit 104*b* may have different numbers of transistors in all of the arm circuits.

The shunt circuit 104*b* generally comprises the arm circuit 130*a*, a block (or circuit) 132*a*, the arm circuit 134 and the resistors RF-RH. The intermediate node 136 of the shunt circuit 104*b* may be connected to the intermediate node 120 of a bridge circuit 102/102*a*/102*b* to receive the signal INT. The intermediate node 136 may be connected through the resistors RF-RH to respective ends of the circuits 130*a*-134. The other ends of the circuits 130*a*-134 may be connected to the signal ground node 96. The circuit 132*a* may implement a shunt arm circuit (or arm circuit for short). The arm circuit 132*a* may be operational to provide either the open circuit condition or the closed circuit condition between the resistors RG and the signal ground node 96. The open/closed conditions may be controlled by the signals CTRE. The arm circuit 132*a* may include multiple transistors (e.g., T transistors). The transistors in the circuit 132*a* may be wired together in series. In various embodiments, each transistor may be a field effect transistor. The transistors within the arm circuit 132*a* may be the same type of transistor(s) as the transistors in the bridge circuits 102-102*b*. In various embodiments, the number of transistors T in the arm circuit 132*a* may be different from the number of transistors S in the arm circuit 130*a* (e.g., S≠T). The number of transistors T in the arm circuit 132*a* may also be different from the number of transistors U in the arm circuit 134 (e.g., T≠U).

A gate of each transistor in the arm circuit 132*a* may be controlled by the signal CTRE. While the signal CTRE is asserted, the arm circuit 132*a* may present the closed state (or condition) between the resistor RF and the signal ground node 96. While the signal CTRE is deasserted, the arm circuit 132*a* may present the open state (or condition) between the resistor RG and the signal ground node 96. In various embodiments, additional resistors and additional arm circuits may be added between the intermediate node 136 and the signal ground node 96. The additional arm circuits may have different numbers of transistors as the arm circuits 130*a*, 132*a* and 134. The additional arm circuits may be controlled by additional components of the signal CTR.

Figure 10:
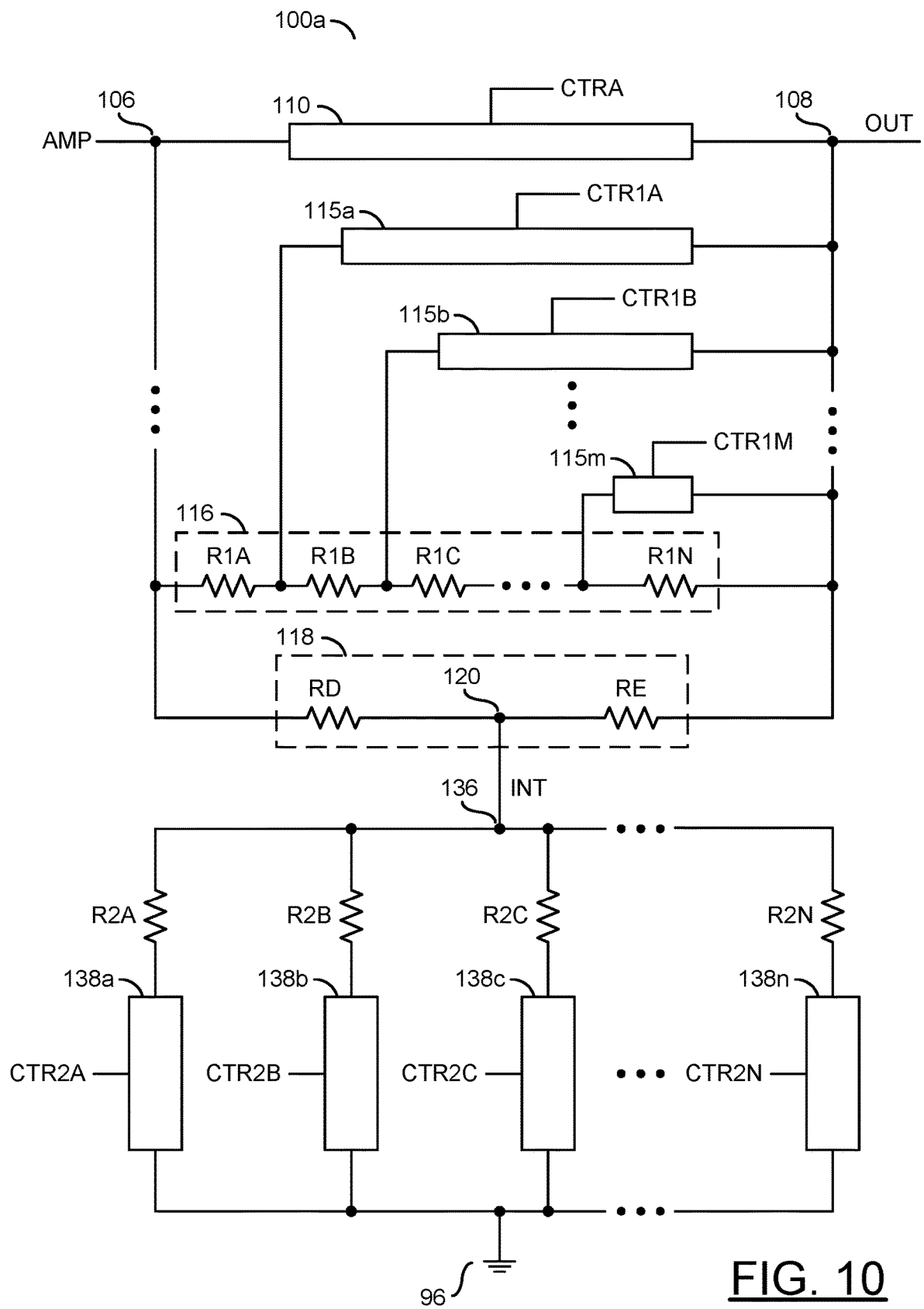
FIG. 10 is a diagram illustrating another attenuator in accordance with an example embodiment of the invention.

Referring to FIG. 10, a diagram illustrating an example implementation of another attenuator 100*a* is shown in accordance with an example embodiment of the invention. The attenuator 100*a* may be a variation of the attenuator 100. The attenuator 100*a* generally comprises the bypass circuit 110, multiple blocks (or circuits) 115*a*-115*m*, multiple blocks (or circuits) 138*a*-138*n*, multiple resistors R1A-R1N, the resistors RD and RE, and multiple resistors R2A-R2N.

The signal AMP may be received at the input node 106. The input node 106 may be connected to all of the circuit 110, the circuit 116 and the circuit 118. The signal OUT may be presented from the output node 108. The output node 108 may be connected to all of the circuit 110, the circuits 115*a*-115*m*, the circuit 116 and the circuit 118. The signal INT may be connected to an intermediate node 120 within the circuit 118. The signal CTR may comprise multiple control signals (or components) (e.g., CTRA and CTR1A-CTR1M). The signal CTRA may be received by the circuit 110. The signals CTR1A-CTR1M may be received by the respective circuits 115*a*-115*m*.

The intermediate node 136 may be connected to the intermediate node 120 to convey the signal INT. In various embodiments, the intermediate node 136 and the intermediate node 120 may be the same node. The resistors R2A-R2N may all be connected to the intermediate node 136. The signal INT may be received by the circuits 138*a*-138*n* through the respective resistors R2A-R2N. Each circuit 138a-138n may have an end connected to the signal ground node 96. The signal CTR may further comprise multiple control signals (or components) (e.g., CTR2A-CTR2N). The circuits 138a-138n may receive the signals CTR2A-CTR2N, respectively.

Each circuit 115a-115m may implement a staggered bridge circuit (or staggered circuit for short). The staggered circuits 115a-115m are generally operational to provide either the open circuit or the closed circuit between respective nodes in the circuit 116 and the output node 108 as controlled by the respective signals CTR1A to CRT1M. While an individual signal CTR1A-CTR1M is asserted, the respective staggered circuit 115a-115m may present the closed state (or condition) between respective intermediate node within the circuit 116 and the output node 108. While an individual signal CTR1A-CTR1M is deasserted, the respective staggered circuit 115a-115m may present the open state (or condition) between the corresponding intermediate node within the circuit 116 and the output node 108.

Each staggered circuit 115a-115m generally comprises multiple transistors. In various embodiments, each transistor may be implemented as a field effect transistor. The transistors within the staggered circuits 115a-115m may be same type of transistor(s) as within the bypass circuit 110. The transistors within the staggered circuits 115a-115m may be wired in series with each other. A gate of each transistor may receive a corresponding signal CTR1A-CTR1M to switch the transistors between the conducting condition (e.g., the closed state) and the non-conducting condition (e.g., the open state). In various embodiments, additional stagger circuits may be added between respective nodes in the circuit 116 and the output node 108. The additional stagger circuits may be controlled by additional components of the signal CTR.

Each circuit 138a-138n may implement a shunt arm circuit (or arm circuit for short). The arm circuits 138a-138n may be operational to provide either the open circuit condition or the closed circuit condition between the respective resistors R2A-R2N and the signal ground node 96. The open/closed conditions may be controlled by the respective signals CTR2A-CTR2N.

Each arm circuit 138a-138n may include multiple transistors. The transistors in each arm circuit 138a-138n may be wired together in series. In various embodiments, each transistor may be a field effect transistor. The transistors within each arm circuit 138a-138n may be the same type of transistor(s) as the transistors in the bypass circuit 110.

A gate of each transistor in the arm circuits 138a-138n may be controlled by the corresponding signals CTR2A-CTR2N. While a signal CTR2A-CTR2N is asserted, the corresponding arm circuit 138a-138n may present the closed state (or condition) between the corresponding resistor R2A-R2N and the signal ground node 96. While a signal CTR2A-CTR2N is deasserted, the corresponding arm circuit 138a-138n may present the open state (or condition) between the corresponding resistor R2A-R2N and the signal ground node 96. In various embodiments, additional resistors and additional arm circuits may be added between the intermediate node 136 and the signal ground node 96. The additional resistors and the additional arm circuits may be controlled by additional components of the signal CTR.

Figure 11:
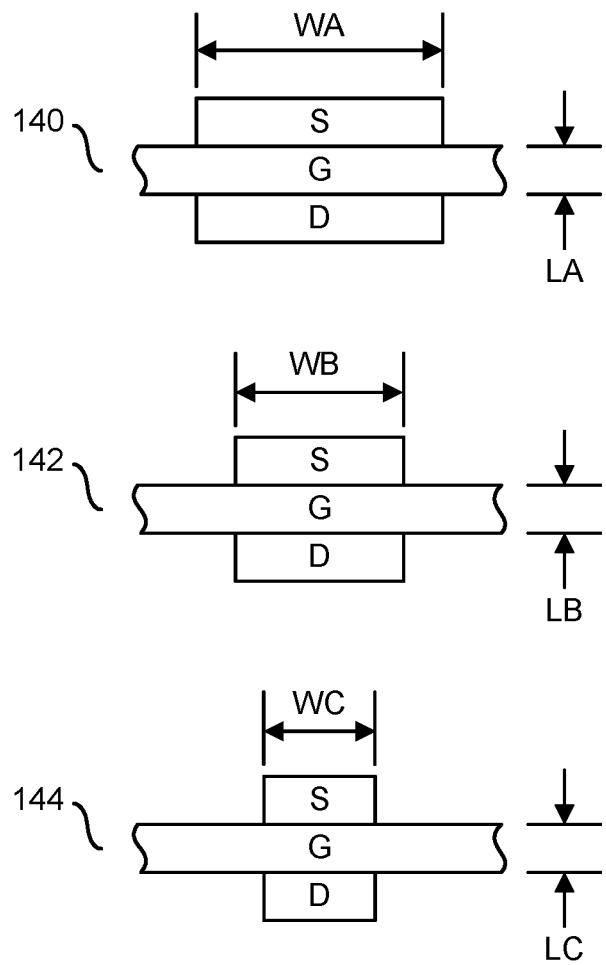
FIG. 11 is a diagram illustrating relative channel sizes of multiple transistors in accordance with an example embodiment of the invention.

Referring to FIG. 11, a diagram illustrating relative channel sizes in example implementations of multiple transistors 140-142 is shown in accordance with an example embodiment of the invention. Each transistor 140-142 may be implemented as a field effect transistor. Various mixes of the transistors 140-142 may be used to implement the bridge circuits 102-102b and the shunt circuits 104-104b. Each transistor 140-142 generally comprises a gate (G) node, a source (S) node and a drain (D) node.

The transistor 140 may implement a large transistor. The transistor 140 may have a channel width (or periphery width) WA and a channel length LA. In various embodiments, the channel width WA may range from approximately 2.4 millimeters (mm) to approximately 3.6 mm. The channel length LA may be approximately 190 nanometers (nm) to approximately 290 nm. Other channel widths and/or channel lengths may be implemented to meet the design criteria of a particular application.

The transistor 142 may implement a medium transistor. The transistor 142 may have a channel width (or periphery width) WB and a channel length LB. The channel width WB of the transistor 142 is generally smaller than that channel width WA of the transistor 140. The smaller channel width WB may result in the transistor 142 having a higher impedance than the transistor 140 while both are in a conducting (or closed) state. In some cases, the channel length LB of the transistor 142 may be shorter than the channel length LA of the transistor 140. In various embodiments, the channel width WB may range from approximately 0.9 mm to approximately 1.5 mm. The channel length LB may be approximately 190 nm to 290 nm. Other channel widths and/or channel lengths may be implemented to meet the design criteria of a particular application.

The transistor 144 may implement a small transistor. The transistor 144 may have a channel width (or periphery width) WC and a channel length LC. The channel width WC of the transistor 144 is generally smaller than that channel width WB of the transistor 142. The smaller channel width WC may result in the transistor 144 having a higher impedance than the transistor 142 while both are in a conducting (or closed) state. In some cases, the channel length LC of the transistor 144 may be shorter than the channel length LB of the transistor 142. In various embodiments, the channel width WC may range from approximately 0.9 mm to approximately 1.5 mm. The channel length LB may be approximately 78 nm to 290 nm. Other channel widths and/or channel lengths may be implemented to meet the design criteria of a particular application.

A respective conducting mode (e.g., closed state) impedance of each bypass circuit 110, each staggered circuit 112-112b, 114-114b and 115a-115m and each arm circuit 130-130a, 132-132a, 134 and 138a-138n may be determined by a total number of transistors used to implement the circuits 110-138n. The respective conducting mode impedance of the circuits 110-138n may be increased by increasing the number of transistors implemented within the circuits.

The respective conducting mode impedance of each bypass circuit 110, each staggered circuit 112-112b, 114-114b and 115a-115m and each arm circuit 130-130a, 132-132a, 134 and 138a-138n may also be determined by the size of the transistors 140-144 used to implement the circuits 110-138n. The respective conducting mode impedance of the circuits 110-138n may be increased by using the medium transistors 142 in place of the large transistors 140, using the small transistors 144 in place of the medium transistors 142 and/or using the small transistors 144 in place of the large transistors 140.

A total impedance though each bridge of the bridge circuits 102-102b and/or each arm of the shunt circuits 104-104b may be adjusted by implementing different numbers of transistors in the circuits 110-138n, different sizes of the transistors in the circuits 110-138n and/or different resistances in the resistors RA-R2N. For example, while the signals CTRA and CTRB in the off state and the signal CTRC in the on state, the impedance of the bridge circuit 102 (FIG. 3) between the node 124 and the output node 108 may be controlled by a design of the conductive impedance through the stagger circuit 114 in parallel with the resistance of the resistor RC. The total impedance of the parallel paths from the node 124 to the output node 108 may be increased by (i) increasing a number of transistors in the stagger circuit 114, (ii) decreasing a size of the transistors in the stagger circuit 114, (iii) increasing the resistance of the resistor RC or (iv) any combination thereof. The number of transistors and the size of the transistors used in a particular implementation generally depends on maximum power levels, intended impedances and maximum voltages experienced by the attenuator 100.

While FIGS. 3 and 5-7 show the various bypass circuits 110 and the stagger circuits 112-112b and 114-114b implemented with three to five transistors each, other numbers of transistors may be implemented to meet the design criteria of a particular application. In various embodiments, each circuit 110, 112, 114 and 115a-115m may be implemented with 12-16 transistors (e.g., 14, and 14 transistors respectively for three stagger circuit designs). The different sized transistors 140-142 may be used in the circuits 110-115m (e.g., large, medium and small transistors respectively) to establish the conducting mode impedances. Other combinations of transistor numbers and/or transistor sizes may be implemented to meet the design criteria of a particular application.

While FIGS. 4, 8 and 9 show the various arm circuits 130-130b, 132-132b and 134 implemented with three to five transistors each, other numbers of transistors may be implemented to meet the design criteria of a particular application. In some designs, each circuit 130, 132, 134 and 138a-138n may be implemented with 22 to 31 transistors (e.g., 24, 29 and 29 transistors respectively in three arm circuit designs). The different sized transistors 140-142 may be used in the circuits 130-138n to establish the conducting mode impedances (e.g., large, medium and small respectively). Other combinations of transistor numbers and/or transistor sizes may be implemented to meet the design criteria of a particular application.

The functions and structures illustrated in the diagrams of FIGS. 1 to 11 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may also be implemented in one or more of ASICs (application specific integrated circuits), FPGAs (field programmable gate arrays), PLDs (programmable logic devices), CPLDs (complex programmable logic device), sea-of-gates, ASSPs (application specific standard products), and integrated circuits. The circuitry may be implemented based on one or more hardware description languages. Embodiments of the present invention may be utilized in connection with flash memory, nonvolatile memory, random access memory, read-only memory, magnetic disks, floppy disks, optical disks such as DVDs and DVD RAM, magneto-optical disks and/or distributed storage systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
a bypass circuit having a predetermined number of a plurality of transistors connected in series between an input node and an output node;
a resistor circuit having a given number of a plurality of resistors connected in series between said input node and said output node, wherein adjoining pairs of said resistors are connected at a plurality of given nodes; and
a plurality of staggered circuits connected between said given nodes and either said input node or said output node, wherein (i) each of said staggered circuits has a respective number of said transistors connected in series and (ii) said bypass circuit, said resistor circuit and said staggered circuits form part of a bridge attenuator.

2. The apparatus according to claim 1, wherein each of said staggered circuits has fewer of said transistors than said bypass circuit.

3. The apparatus according to claim 1, wherein at least one of said staggered circuits has fewer of said transistors than another of said staggered circuits.

4. The apparatus according to claim 1, wherein said bypass circuit and each of said staggered circuits have a same number of said transistors.

5. The apparatus according to claim 1, wherein said transistors in each of said bypass circuit and said staggered circuits are controlled between an open state and a closed state by a respective one of a plurality of control signals.

6. The apparatus according to claim 1, wherein a sum of a plurality of drain-to-source breakdown voltages of said transistors in said staggered circuits is less than a maximum voltage swing between said input node and said output node.

7. The apparatus according to claim 1, further comprising an additional resistor circuit having (i) an additional number of said resistors connected in series between said input node and said output node and (ii) an intermediate node connected between two of said resistors in said additional resistor circuit.

8. The apparatus according to claim 7, further comprising a plurality of shunt arm circuits connected in parallel and configured to vary an impedance between said intermediate node to a ground node.

9. The apparatus according to claim 1, wherein transistors in said bypass circuit occupy more area than said transistors in said staggered circuits.

10. The apparatus according to claim 1, wherein said transistors in one of said staggered circuits occupy more area than said transistors in another of said staggered circuits.

11. An apparatus comprising:
a shunt circuit configured to vary an impedance between an intermediate node and a ground node in response to a control signal; and
a bridge circuit (i) connected to said intermediate node, an input node and an output node and (ii) configured to generate an output signal by attenuating an input signal in response to said control signal, wherein (a) said bridge circuit includes (i) a bypass circuit having a predetermined number of a plurality of transistors connected in series (ii) a resistor circuit having a given number of a plurality of resistors connected in series at a plurality of given nodes and (iii) a plurality of staggered circuits connected between said given nodes and either said input node or said output node and (b) each of said staggered circuits has a respective number of said transistors connected in series.

12. The apparatus according to claim 11, wherein each of said staggered circuits has fewer of said transistors than said bypass circuit.

13. The apparatus according to claim 11, wherein at least one of said staggered circuits has fewer of said transistors than another of said staggered circuits.

14. The apparatus according to claim 11, wherein said bypass circuit and each of said staggered circuits have a same number of said transistors.

15. The apparatus according to claim 11, wherein said transistors in each of said bypass circuit and said staggered circuits are controlled between an open state and a closed state by a respective one of a plurality of components of said control signal.

16. The apparatus according to claim 11, wherein a sum of a plurality of drain-to-source breakdown voltages of said transistors in said staggered circuits is less than a maximum voltage swing between said input node and said output node.

17. The apparatus according to claim 11, wherein said bridge circuit further includes an additional resistor circuit having (i) an additional number of said resistors connected in series between said input node and said output node and (ii) said intermediate node is connected between two of said resistors in said additional resistor circuit.

18. The apparatus according to claim 11, wherein said transistors in said bypass circuit occupy more area than said transistors in said staggered circuits.

19. The apparatus according to claim 11, wherein said transistors in one of said staggered circuits occupy more area than said transistors in another of said staggered circuits.

* * * * *